United States Patent [19]

Benebo et al.

[11] Patent Number: 5,733,466
[45] Date of Patent: Mar. 31, 1998

[54] ELECTROLYTIC METHOD OF DEPOSITING GOLD CONNECTORS ON A PRINTED CIRCUIT BOARD

[75] Inventors: Biebele Opubo Benebo; Edmund Glenn Benjamin, both of Endwell; Robert Douglas Edwards; John Joseph Konrad, both of Endicott; Timothy Leroy Wells, Apalachin, all of N.Y.; Jerzy Maria Zalesinski, Essex Junction, Vt.

[73] Assignee: International Business Machines Corporation, Armonk, N.Y.

[21] Appl. No.: 596,052

[22] Filed: Feb. 6, 1996

[51] Int. Cl.$^6$ ............................................. B44C 1/22
[52] U.S. Cl. .......................... 216/13; 216/18; 216/41
[58] Field of Search .............................. 216/13, 18, 41, 216/56, 78, 105; 29/852; 427/96, 98; 428/209; 205/164

[56] References Cited

U.S. PATENT DOCUMENTS

| | | | |
|---|---|---|---|
| 4,652,345 | 3/1987 | McBride et al. | 204/14.3 |
| 5,166,037 | 11/1992 | Atkinson et al. | 430/315 |
| 5,176,811 | 1/1993 | Keim et al. | 205/164 |

OTHER PUBLICATIONS

Research Disclosure, Feb. 1988, #286; Internal Commoning Bar For Plating Of PC Card Tabs.
Research Disclosure, Apr. 1990, #312; Notched Commoning Bar; Jung et al.
Research Disclosure, Jan. 1990, #309; Grounding Printed Circuit Assm. With Commoning Bars, by P.M. Rogers et al.

IBM Technical Disclosure Bulletin; Selective Polymer Coating Of Dissimilar Metals; Pallady et al; vol. 13, No. 10, Mar. 1971.

Primary Examiner—William Powell
Attorney, Agent, or Firm—Richard M. Goldman

[57] ABSTRACT

Electrodepositing a metallurgy such as gold on to printed circuit board features. The methods include electrolessly depositing a copper layer over the surface of the printed circuit board. This is followed by applying a layer of photoresist atop the electroless copper, and exposing and developing the photoresist to uncover areas to be etched, leaving behind the specific features to be plated. By this expedient the remaining copper forms a commoning layer. The remaining photoresist is stripped to uncover the copper commoning layer, and a second layer of photoresist is applied atop the partially etched copper layer. This layer of photoresist is exposed and developed to uncover the features to be plated. These features are then plated with the metallurgy of choice. The photoresist is then stripped off and the electroless copper layer can remain if needed for further processing or be microetched off without harming copper traces that may exist below the electroless copper layer.

11 Claims, 5 Drawing Sheets

START WITH UNCIRCUITIZED COPPER FOIL CLAD OR BARE DIELECTRIC PRINTED CIRCUIT BOARD.

APPLY ELECTROLESS COPPER.

APPLY PHOTORESIST ATOP COPPER.

PHOTOPROCESS TO UNCOVER FEATURE PERIPHERIES.

ETCH PERIPHERIES TO DEFINE FEATURES BY VOIDING THE COPPER TO THE DIELECTRIC.

STRIP PHOTORESIST. **

REAPPLY PHOTORESIST.

PHOTOPROCESS TO UNCOVER FEATURES.

ELECTROPLATE DESIRED METALLURGY UPON FEATURES.

STRIP PHOTORESIST.

READY FOR PATTERN PLATE RESIST APPLY.

** - OPTIONAL PROCESS STEP, HIGHLY RECOMMENDED FOR BEST RESULTS.

FIGURE 3A

START WITH A FULL PANEL PLATED PRINTED CIRCUIT BOARD.

APPLY ELECTROLESS COPPER. *

APPLY PHOTORESIST ATOP COPPER.

PHOTOPROCESS TO UNCOVER FEATURE PERIPHERIES.

ETCH PERIPHERIES TO DEFINE FEATURES BY VOIDING THE COPPER TO THE DIELECTRIC.

STRIP PHOTORESIST. **

REAPPLY PHOTORESIST.

PHOTOPROCESS TO UNCOVER FEATURES.

ELECTROPLATE DESIRED METALLURGY UPON FEATURES.

STRIP PHOTORESIST.

READY FOR SUBTRACTIVE ETCH RESIST APPLY.

* - OPTIONAL PROCESS STEP

** - OPTIONAL PROCESS STEP, HIGHLY RECOMMENDED FOR BEST RESULTS.

FIGURE 3B

START WITH CIRCUITIZED PRINTED CIRCUIT BOARD.

APPLY ELECTROLESS COPPER.

APPLY PHOTORESIST ATOP COPPER.

PHOTOPROCESS TO UNCOVER FEATURE PERIPHERIES.

MICROETCH ELECTROLESS COPPER FROM PERIPHERIES LEAVING THE FEATURE DEFINED AND INTACT.

STRIP PHOTORESIST. *

REAPPLY PHOTORESIST.

PHOTOPROCESS TO UNCOVER FEATURES.

ELECTROPLATE DESIRED METALLURGY UPON FEATURES.

STRIP PHOTORESIST.

MICROETCH ELECTROLESS COPPER FROM PRINTED CIRCUIT BOARD LEAVING COPPER TRACES UNHARMED.

\* - OPTIONAL PROCESS STEP. HIGHLY RECOMMENDED FOR BEST RESULTS.

FIGURE 4

ELECTROLYTIC METHOD OF DEPOSITING GOLD CONNECTORS ON A PRINTED CIRCUIT BOARD

FIELD OF THE INVENTION

The invention relates to electronic circuit packages having gold or other special metallurgical plated features. Heretofore, these features were formed by electroless deposition or by electrodeposition with the use of a commoning bar. Such features include tabs for various connectors, wire bond sites and circuit lines. The invention relates to the electrodeposition of a metallurgy, such as gold or a gold-nickel laminate or multilayer, upon these printed circuit board features without the provision of a commoning bar.

BACKGROUND OF THE INVENTION

Electrical connection between printed circuit boards and cards and external systems are provided by gold contacts, as edge tabs, chip tabs, and lands. The external system can be integrated circuit chips, adapter cards, and external systems. The gold contacts atop lands and tabs are typically provided by electrodeposition.

However electrodeposition requires a commoning bar. The commoning bar is required as the cathodic lead for the features to be plated. Many applications require that the commoning bar be removed after card or board fabrication. This is an additional set of manufacturing steps at an additional cost. Also, printed circuit boards with interstitial edge connectors or high circuit density do not allow for commoning bars. Thus, a need exists for a method for electroplating gold electrical connectors without the use of a commoning bar.

The alternative technique is electroless deposition of gold from autocatalytic electroless baths. These baths are expensive and very difficult to control. They can only be operated successfully within a narrow range of bath and plating parameters. Electroless deposition also provides a gold deposit that is very soft and not suitable for an application requiring wear resistance, that is, an application having a hard gold requirement.

OBJECTS OF THE INVENTION

It is a primary object of the invention to provide a method for electrolytically plating a metallurgy such as gold on printed circuit board features, such as lands, tabs, contacts, and pads, without the use of a commoning bar.

SUMMARY OF THE INVENTION

The above object and other objects of the invention are attained by the method of the invention. According to the method of the invention, features, as lands, tabs, contacts, and pads, are electrolytically deposited with gold or gold-nickel where nickel is deposited prior to gold as a barrier layer, or other metallurgy, without the use of a commoning bar. The embodiments of the invention use an electroless copper film, coating, or layer as a temporary commoning layer for electrodeposition of the metallurgy.

The first embodiment of the invention includes the steps of electrolessly depositing a copper layer atop an unplated, uncircuitized printed circuit board (copper clad or bare dielectric). This is followed by applying a layer of photoresist atop the electroless copper layer, and exposing and developing the photoresist to uncover the surrounding areas around the features to be plated with the desired metal. This is followed by etching the uncovered areas of the printed circuit board to form voids surrounding the features to be plated. By this expedient the remaining electroless copper beneath the photoresist forms a commoning layer. The photoresist is stripped to uncover the copper commoning layer, and a second layer of photoresist is applied atop the partially etched copper layer. This layer of photoresist is exposed and developed to uncover only the features to be electroplated. These features are then plated with the desired metallurgy. The remaining photoresist is stripped away and the printed circuit board is now ready for the resist apply step for pattern plating the circuitry onto the panel as widely understood within the industry.

The electroless layer is not required if the printed circuit board is full panel copper plated prior to performing the above process. Subtractive circuitization would then follow in place of pattern plating.

The second embodiment of the invention includes electrolessly depositing a copper layer atop a fully circuitized printed circuit board. This is followed by applying a layer of photoresist atop the electroless copper layer, and exposing and developing the photoresist to uncover the feature to be plated and the surrounding area. This is followed by microetching the uncovered areas of the printed circuit board to form voids surrounding the features to be electroplated. By this expedient the remaining electroless copper beneath the photoresist forms a commoning layer. The photoresist is stripped to uncover the copper commoning layer, and a second layer of photoresist is applied atop the partially etched copper layer. This layer of photoresist is exposed and developed to uncover only the features to be electroplated. These features are then electroplated with the desired metallurgy, such as gold. The remaining photoresist is stripped away and the remaining electroless copper layer is then microetched away without significant attack to the other copper traces.

Also to be noted is the fact that if an entire full image circuitry surface finish metallurgy is required and commoning is achievable by opposite side electroless Cu commoning, only one photoresist layer sequence would be required. Complete resist develop and microetch step for the side requiring the surface finish metallurgy would provide sufficient feature isolation prior to surface finish metallurgy plating.

THE FIGURES

The invention may be understood by reference to the FIGURES appended hereto.

FIG. 1 is a partial cutaway view of a microelectronic circuit package prepared according to the method of the invention. Element 1 is the circuit package, elements 21 are a pair of polymeric layers, elements 30 are circuit traces, elements 31 are tabs produced according to the method of the invention, elements 41 are through holes, and element 51 is an integrated circuit chip shown in phantom view.

FIG. 2 is a cutaway elevation view of a tab 31 prepared according to the invention. Element 31 is the tab, element I. is the underlying prepreg, element II. is the copper feature (copper foil, foil and electroplated copper and/or electroless copper) and element III. is the electroplated metallurgy of choice such as nickel/gold.

FIGS. 3A and 3B are process flow charts for alternative embodiments of the invention. FIG. 3A is a flow chart according to one embodiment of the invention carried out on an uncircuitized printed circuit board or card in a pattern plate circuitization strategy. FIG. 3B is a flow chart according to an alternative embodiment with a subtractive circuitization strategy.

FIG. 4 is a flow chart according to an alternative embodiment of the invention carried out on a circuitized printed circuit board or card.

DETAILED DESCRIPTION OF THE INVENTION

Figure 1:
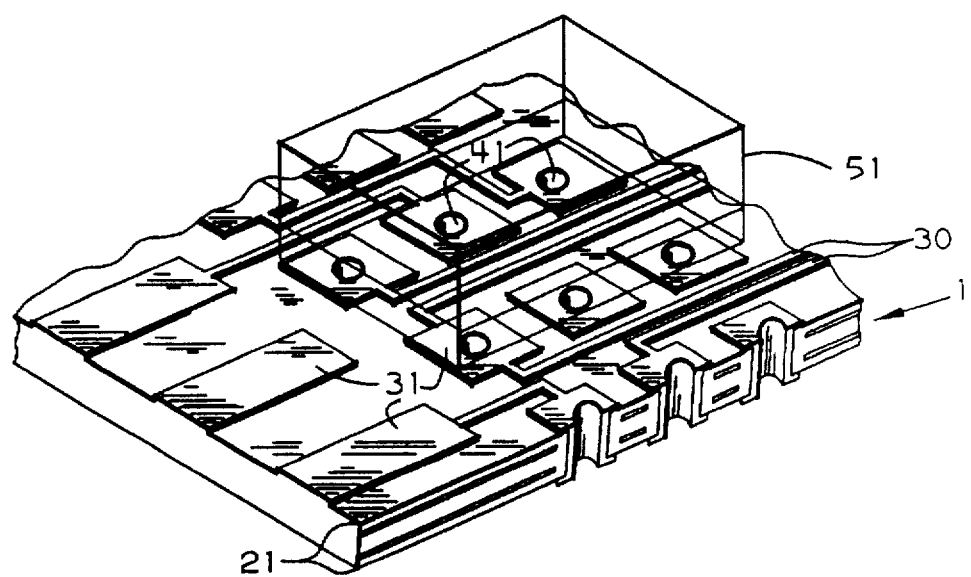

The invention is useful in preparing printed circuit boards of the type shown in FIG. 1. These printed circuit boards have a circuit package 1, where elements 21 are a pair of polymeric layers, elements 30 are circuit traces, elements 31 are tabs produced according to the method of the invention, elements 41 are through holes, and element 51 is an integrated circuit chip shown in phantom view.

Figure 2:
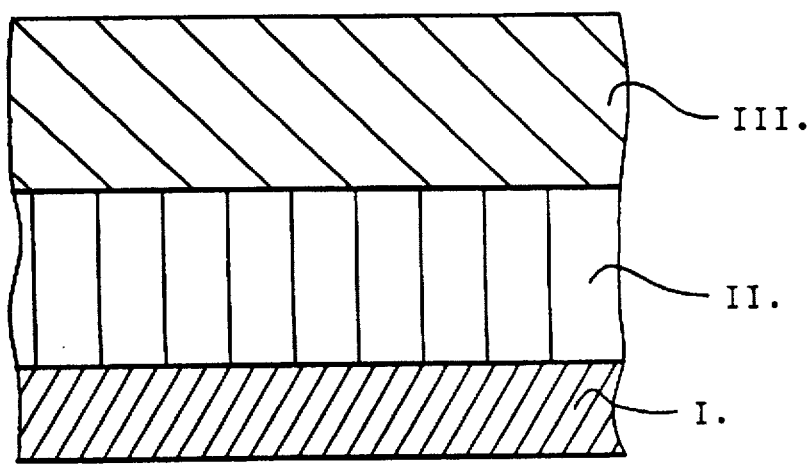

The tabs 31 have the structure shown in FIG. 2 where element I. is the underlying prepreg, element II. is the copper feature (copper foil, foil and electroplated copper and/or electroless copper) and element III. is the electroplated metallurgy of choice such as nickel/gold. Other structures or features, as lands, pads, or connectors, may be prepared by the method of the invention.

According to one exemplification of the invention, having the steps shown in FIGS. 3A and 3B, the method includes the steps of electrolessly depositing a copper layer atop uncovered surfaces of an uncircuitized printed circuit board. The electroless deposition of the copper is carried out by methods well known in the art. This electroless deposition is followed by applying a layer of photoresist atop the electroless copper layer, and exposing and developing the photoresist to uncover areas surrounding the features to be electroplated with the chosen metallurgy, but leaving the actual features covered by photoresist. This photolithographic step is followed by etching the uncovered areas of the printed circuit board to form voids surrounding the features to be plated. By this expedient the remaining copper forms a commoning layer. The remaining photoresist is stripped to uncover the copper commoning layer, and a second layer of photoresist is applied atop the partially etched electroless Cu layer. This layer of photoresist is exposed and developed to uncover the features to be plated. These features are then electroplated with the desired metallurgy, such as gold, including gold with a nickel barrier layer. These features will have an underlayer of electroless copper and an outer layer of the electrodeposited metallurgy, as shown in FIG. 2. The remaining photoresist is stripped, and circuitization of the copper traces can be carried out. The circuitization can be additive or subtractive. The electroless copper layer, where not needed, will be etched away in the circuitization steps.

According to an alternative exemplification of the invention, having the steps shown in FIG. 4, the method includes the steps of electrolessly depositing a copper layer atop exposed surfaces of a circuitized printed circuit board. The electroless deposition of the copper is carried out by methods well known in the art. A layer of photoresist is applied atop the electroless copper layer. The layer of photoresist is exposed and developed to uncover the features to be plated as well as the surrounding areas. This photolithographic step is followed by microetching the uncovered areas of the printed circuit board to form voids surrounding the features to be plated. By this expedient the remaining electroless copper forms a commoning layer. The remaining photoresist is stripped to uncover the copper commoning layer and surface circuitization, and a second layer of photoresist is applied atop the partially etched copper layer. This layer of photoresist is exposed and developed to uncover the features to be electroplated with the metallurgy of choice. These features may not have the underlayer of electroless copper but do have the outer layer of the electrodeposited metallurgy. The remaining photoresist is stripped uncovering the surface circuitization and electroless copper commoning layer. The electroless copper layer is then microetched away without harming the surface circuitized traces.

The electroless copper layer used as a commoning layer is typically about 40 to 80 microinches thick and is deposited by an autocatalytic electroless copper bath over a palladium seed. The palladium seed is of such a thin layer it is to be considered as part of the electroless copper layer as it will behave similarly as the electroless copper when being etched with typical etchants. If using the embodiment of the invention with an uncircuitized printed circuit board with bare dielectric on the surface, the surface should be roughened first to promote adhesion and a thicker layer of electroless copper should be used (120 microinches minimum).

If the metallurgy to be plated is gold, it is almost always precluded with a barrier layer of nickel, of 100 microinch minimum thickness. The nickel is electrodeposited nickel from a nickel sulfate or nickel sulfamate bath. The gold is then electroplated immediately after atop the nickel barrier to a typical minimum thickness of 30 microinches. The typical electrolytic gold bath is comprised of $KAu(CN)_2$ and buffering conducting salts as citrates, oxalates, phosphates, and the like.

The copper circuit traces may be present before the metallurgy is electroplated, or the copper trace circuitization may be applied after the metallurgy is plated. The copper traces can be applied by additive or subtractive circuitization.

While the invention has been described with respect to certain preferred embodiments and exemplifications, it is not intended to limit the scope of the invention thereby, but solely by the claims appended hereto.

We claim:

1. A method of electrodepositing a gold metallurgy onto a feature of a printed circuit board comprising the steps of:
   a. electrolessly depositing a copper layer atop exposed surfaces of an uncircuitized copper clad or bare dielectric printed circuit board;
   b. applying a layer of photoresist atop the electroless copper layer;
   c. exposing and developing the photoresist to uncover areas surrounding the features to be electroplated while the background Cu remains covered by photoresist;
   d. etching the uncovered areas of the printed circuit board to form voids surrounding the features to be electroplated whereby the remaining electroless copper forms a commoning layer;
   e. stripping the remaining photoresist to uncover the copper commoning layer;
   f. applying a layer of photoresist atop the partially etched copper layer;
   g. exposing and developing the photoresist to uncover the features to be plated with the desired metallurgy;
   h. electroplating the metallurgy atop the features thereby forming conformally plated features with a specific metallurgy;
   i. stripping the remaining photoresist; and
   j. circuitizing the uncovered layers of the printed circuit board either additively or subtractively.

2. A method of electrodepositing metallurgy onto a feature of a printed circuit board comprising the steps of:

a. electrolessly depositing a copper layer atop exposed surfaces of a circuitized printed circuit board;

b. applying a layer of photoresist atop the electroless copper layer;

c. exposing and developing the photoresist to uncover the features to be plated and surrounding peripheries;

d. microetching the uncovered areas of the printed circuit board to form voids to the dielectric in the peripheries while leaving a copper trace to be electroplated intact whereby the remaining electroless copper forms a commoning layer;

e. stripping the remaining photoresist to uncover the copper commoning layer;

f. reapplying a layer of photoresist atop the partially etched copper layer;

g. exposing and developing the photoresist to uncover only the features to be electroplated with the desired metallurgy;

h. electroplating the metallurgy atop the features thereby forming conformally plated features with a specific metallurgy;

i. stripping the remaining photoresist; and j. microetching the remaining electroless copper while leaving copper traces intact.

3. The method of claim 2 wherein the metallurgy is gold.

4. A printed circuit board having an electrical feature thereon, said feature comprising metallurgy atop a layer of electroless copper atop the board dielectric, said feature prepared by the method comprising the steps of:

a. electrolessly depositing a copper layer atop exposed surfaces of an uncircuitized copper clad or bare dielectric printed circuit board;

b. applying a layer of photoresist atop the electroless copper layer;

c. exposing and developing the photoresist to uncover areas surrounding the features to be electroplated while the background Cu remains covered by photoresist;

d. etching the uncovered areas of the printed circuit board to form voids surrounding the features to be electroplated whereby the remaining electroless copper forms a commoning layer;

e. stripping the remaining photoresist to uncover the copper commoning layer;

f. applying a layer of photoresist atop the partially etched copper layer;

g. exposing and developing the photoresist to uncover the features to be plated with the desired metallurgy;

h. electroplating the metallurgy atop the features thereby forming conformally plated features with a specific metallurgy;

i. stripping the remaining photoresist; and j. circuitizing the uncovered layers of the printed circuit board either additively or subtractively.

5. The printed circuit board of claim 4 wherein the metallurgy comprises gold.

6. A printed circuit board comprising an electrical feature thereon, said feature comprising metallurgy atop a layer of electroless copper atop a copper foil layer atop the board dielectric, said feature prepared by the method comprising the steps of:

a. electrolessly depositing a copper layer atop exposed surfaces of an uncircuitized copper clad or bare dielectric printed circuit board;

b. applying a layer of photoresist atop the electroless copper layer;

c. exposing and developing the photoresist to uncover areas surrounding the features to be electroplated while the background Cu remains covered by photoresist;

d. etching the uncovered areas of the printed circuit board to form voids surrounding the features to be electroplated whereby the remaining electroless copper forms a commoning layer;

e. stripping the remaining photoresist to uncover the copper commoning layer;

f. applying a layer of photoresist atop the partially etched copper layer;

g. exposing and developing the photoresist to uncover the features to be plated with the desired metallurgy;

h. electroplating the metallurgy atop the features thereby forming conformally plated features with a specific metallurgy;

i. stripping the remaining photoresist; and j. circuitizing the uncovered layers of the printed circuit board either additively or subtractively.

7. The printed circuit board of claim 6 wherein the metallurgy comprises gold.

8. A printed circuit board having an electrical feature thereon, said feature comprising metallurgy atop a layer of electroplated copper atop a layer of electroless copper atop a layer of copper foil atop board dielectric, said electrical feature prepared by the method comprising the steps of:

a. electrolessly depositing a copper layer atop exposed surfaces of an uncircuitized copper clad or bare dielectric printed circuit board;

b. applying a layer of photoresist atop the electroless copper layer;

c. exposing and developing the photoresist to uncover areas surrounding the features to be electroplated while the background Cu remains covered by photoresist;

d. etching the uncovered areas of the printed circuit board to form voids surrounding the features to be electroplated whereby the remaining electroless copper forms a commoning layer;

e. stripping the remaining photoresist to uncover the copper commoning layer;

f. applying a layer of photoresist atop the partially etched copper layer;

g. exposing and developing the photoresist to uncover the features to be plated with the desired metallurgy;

h. electroplating the metallurgy atop the features thereby forming conformally plated features with a specific metallurgy;

i. stripping the remaining photoresist; and j. circuitizing the uncovered layers of the printed circuit board either additively or subtractively.

9. The printed circuit board of claim 8 wherein the metallurgy comprises gold.

10. A printed circuit board having an electrical feature thereon, said feature comprising metallurgy atop a layer of electroplated copper atop a layer of electroless copper atop a layer of copper foil atop board dielectric, said electrical feature prepared by the method comprising the steps of:

a. electrolessly depositing a copper layer atop exposed surfaces of a circuitized printed circuit board;

b. applying a layer of photoresist atop the electroless copper layer;

c. exposing and developing the photoresist to uncover the features to be plated and surrounding peripheries;

d. microetching the uncovered areas of the printed circuit board to form voids to the dielectric in the peripheries while leaving a copper trace to be electroplated intact whereby the remaining electroless copper forms a commoning layer;

e. stripping the remaining photoresist to uncover the copper commoning layer;

f. reapplying a layer of photoresist atop the partially etched copper layer;

g. exposing and developing the photoresist to uncover only the features to be electroplated with the desired metallurgy;

h. electroplating the metallurgy atop the features thereby forming conformally plated features with a specific metallurgy;

i. stripping the remaining photoresist; and j. microetching the remaining electroless copper while leaving copper traces intact.

11. The printed circuit board of claim 10 wherein the metallurgy comprises gold.

* * * * *